(12) United States Patent
Chen (10) Patent No.: US 8,711,988 B2
(45) Date of Patent: *Apr. 29, 2014

(54) METHOD AND APPARATUS FOR GENERATING SOFT BIT VALUES IN REDUCED-STATE EQUALIZERS

(75) Inventor: Dayong Chen, Cary, NC (US)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 13/609,865

(22) Filed: Sep. 11, 2012

(65) Prior Publication Data

US 2013/0064332 A1 Mar. 14, 2013

Related U.S. Application Data

(63) Continuation of application No. 12/427,458, filed on Apr. 21, 2009, now Pat. No. 8,300,739.

(51) Int. Cl.
*H04L 27/06* (2006.01)

(52) U.S. Cl.
USPC .......................................... 375/341; 375/229

(58) Field of Classification Search
CPC ................... H04B 2201/709727; H04L 1/005; H04L 1/006; H04L 1/0054; H04L 25/03203; H04L 25/03337; H04L 25/03235; H04L 25/067
USPC ................................................. 375/341, 229
See application file for complete search history.

(56) References Cited

U.S. PATENT DOCUMENTS

| | | | | |
|---|---|---|---|---|
| 5,586,128 A | * | 12/1996 | Chen | 714/792 |
| 5,852,630 A | * | 12/1998 | Langberg et al. | 375/219 |
| 6,581,182 B1 | * | 6/2003 | Lee | 714/795 |
| 7,277,506 B1 | * | 10/2007 | Pope et al. | 375/341 |
| 8,300,739 B2 | * | 10/2012 | Chen | 375/341 |
| 2009/0052516 A1 | * | 2/2009 | Chen et al. | 375/232 |

FOREIGN PATENT DOCUMENTS

CN 1476176 A 2/2004

OTHER PUBLICATIONS

Dawid, et al: "Real-time algorithms and VLSI architectures for Soft Output MAP Convolution decoding". p. 193-197. Sep. 27, 1995.
Hagenauer, et al: "Iterative Decoding of Binary Block and Convolution Codes". Mar. 1, 1996.
Berrou, et al: "A Low Complexity Soft-Output Viterbi Decoder Architecture". May 23, 1993. pp. 737-740.

* cited by examiner

*Primary Examiner* — Shuwang Liu
*Assistant Examiner* — David Huang (57) ABSTRACT

A demodulator is provided that functions as a reduced-state equalizer and produces reliable soft bit values. According to an embodiment, soft bit values are generated for a sequence of transmitted symbols using a demodulator by updating an M-state trellis managed by the demodulator responsive to a transition from symbol time n−1 to symbol time n, where M is a function of the number of bits per symbol in the sequence of transmitted symbols. Survivor metrics associated with the M states of the trellis are saved each symbol time so that the demodulator can calculate soft bit values with regard to transitions from symbol time n+D−1 to symbol time n+D. The trellis is traced back through to calculate soft bit values for a symbol detected at symbol time n−D based on survivor metrics saved for the M states at symbol time n−D.

20 Claims, 5 Drawing Sheets

METHOD AND APPARATUS FOR GENERATING SOFT BIT VALUES IN REDUCED-STATE EQUALIZERS

CROSS-REFERENCE TO RELATED APPLICATIONS

This application is a continuation of U.S. application Ser. No. 12/427,458, filed Apr. 21, 2009, now U.S. Pat. No. 8,300, 739 the disclosure of which is incorporated herein by reference.

TECHNICAL FIELD

The present invention generally relates to reduced-state equalizers, and more particularly relates generating reliable soft bit values using reduced-state equalizers.

BACKGROUND

A reduced state equalizer operates on a trellis to estimate a sequence of transmitted symbols, typically using either the Viterbi or BCJR algorithm. The trellis has a number of states at each symbol time, the number of states being a function of the modulation. For example, assuming that the channel has a memory of one-symbol period, a trellis has 64 different states for 64-QAM (quadrature amplitude modulation) and 32 possible states for 32-QAM. Reduced state equalizers prune the trellis when determining the most likely path associated with a sequence of transmitted symbols. By pruning the trellis, the metrics of many paths in the trellis are not evaluated when determining the most likely path, reducing computational complexity. However, soft bit value generation becomes less reliable when trellis paths go unevaluated. This in turn makes it very difficult to obtain accurate probability estimates for the transmitted binary bits within each symbol.

The use of reduced-state equalizers continues to grow as modern wireless communication systems transmit increasingly more bits per symbol. Having a higher symbol bit density exponentially grows the number of paths in the trellis which makes MLSE (Maximum Likelihood Sequence Estimation) and even DFSE (Decision-Feedback Sequence Estimation) equalizers less practical. For example, consider 64-QAM. Each 64-QAM symbol carries 6 bits which is spectrally much more efficient than e.g. GMSK which carries only 1 bit per symbol. However, since each symbol can have one of 64 possible values, the corresponding trellis has 64×64 possible paths from one symbol time to the next symbol time considering the most current two taps of the channel. The DFSE equalizer reduces the number of states by shortening the channel impulse response. For example, the DFSE equalizer truncates the radio channel impulse response length from 7 taps to 2 taps. This way, the number of trellis states evaluated each iteration is reduced from M^7 to M^2 where M is the modulation size. Other reduced-state equalizers such as RSSE (Reduced-State Sequence Estimation) and MA (M-Algorithm) provide similar computational savings. DFSE, RSSE, MA and other types of conventional reduced-state equalizers generate soft bit values each iteration as the trellis is being extended from the current symbol time to the next symbol time. Yet, not all paths between the two symbol times are evaluated by such conventional reduced-state equalizers. Under some conditions, e.g. when the radio channel is effectively shortened to 2 symbols, DFSE can be considered a full-trellis equalizer, i.e. M×M paths are evaluated each iteration. In contrast, RSSE and MA do not have M×M paths but rather G×M paths. The missing paths of the RSSE and MA change constantly each iteration.

The accuracy of the soft bit values generated by a reduced-state equalizer is a function of the number of paths evaluated by the equalizer. A soft bit value is associated with a particular bit within a symbol and is defined as the ratio between the probability that the bit has a "0" value and the bit has a "1" value. If the bit is more likely to be a "0", the ratio is larger than 1 and the log of the ratio is larger than 0, i.e. a positive soft bit value indicates that a bit is more likely to be a "0". With sequence estimation, the equalizer determines the most likely symbol sequence. Each symbol has multiple bits and individual bits of the same symbol have in general different log-likelihood ratios, i.e. soft bit values. A good approximation of the optimum soft bit value, i.e. log-likelihood ratio, is obtained by using a so-called simplified SOVA (soft output viterbi) algorithm. Soft bit value accuracy decreases when less than all of the possible paths are evaluated. In some cases, the accuracy of the soft bit values can degrade so poorly that they become unreliable, e.g. when an entire set of paths goes unevaluated. Accordingly, there is a need for a reduced-state equalizer that produces reliable soft bit values.

SUMMARY

According to the methods, apparatus and computer-readable media disclosed herein, a demodulator is provided that functions as a reduced-state equalizer and produces reliable soft bit values. The trellis is built-out over a sufficiently large number of symbol times so that a symbol in a sequence of transmitted symbols can be reliably detected by tracing back through the trellis to identify the transmit symbol at an earlier symbol time. Soft bit values are generated each iteration, but not with regard to the current symbol time, but instead with regard to a past symbol time. The decision-delayed soft bit value calculation embodiments described herein allow an equalizer to calculate the soft bit values for a single end-state. This is in contrast to conventional equalizers which calculate soft bits values with regard to the current symbol time. Consequently, soft bit values must be calculated for all end-states whereby the number of end-states corresponds to the modulation size.

According to the decision-delayed soft bit value calculation embodiments described herein, soft bit values with regard to the current symbol time are calculated in future iterations. To enable the deferred soft bit value calculation, the equalizer saves the survivor metrics used for computing the path metrics for the current symbol time in a circular buffer. The survivor metric associated with a particular state indicates the probability that the state represents the transmitted symbol associated with the current symbol time. The survivor metrics for the states of the trellis are saved each iteration of the reduced-state equalizer. The cumulative symbol history for each trellis state is also updated in memory each iteration. The saved symbol history is used to trace back through the trellis to identify a detected symbol at an earlier symbol time. The saved survivor metrics for the immediately preceding symbol time enable the equalizer to evaluate all M trellis paths with regard to an ending state for the two earlier symbol times. Soft bit value generation for a particular ending state is then performed using all M path metrics, not a reduced set of G path metrics where G<M. Delaying soft bit value generation in this way increases the accuracy of the soft bit values while still retaining the computational efficiency of a reduced-state equalizer because all paths to the detected ending state are used to generate the soft bit values.

According to an embodiment, soft bit values are generated for a sequence of transmitted symbols using a demodulator by updating an M-state trellis managed by the demodulator responsive to a transition from symbol time n−1 to symbol time n, where M is a function of the number of bits per symbol in the sequence of transmitted symbols. Survivor metrics associated with the M states of the trellis are saved each symbol time so that the equalizer can calculate soft bit values with regard to transitions from symbol time n+D−1 to symbol time n+D. The trellis is traced back through to calculate soft bit values for a symbol detected at symbol time n−D based on survivor metrics saved for the M states at symbol time n−D.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
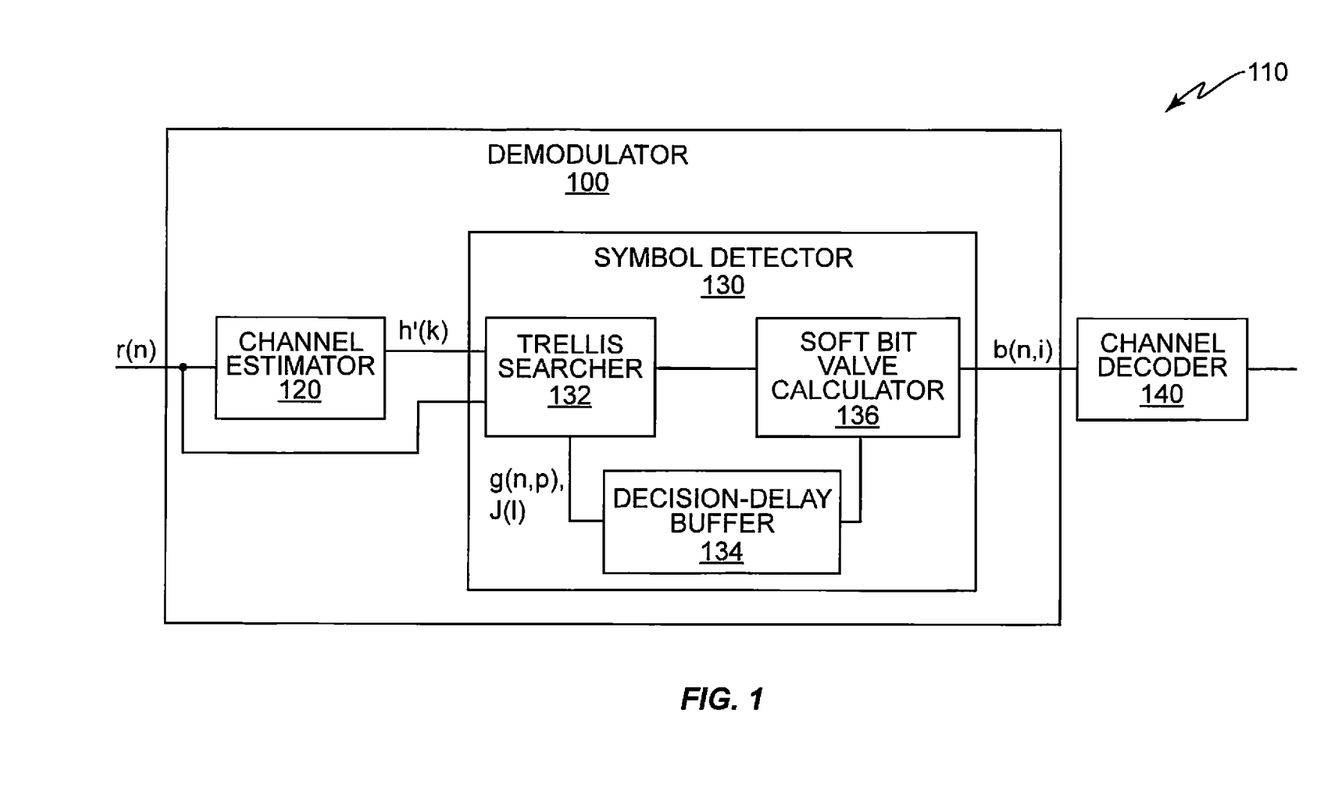
FIG. 1 illustrates a block diagram of an embodiment of a demodulator having a channel estimator and a symbol detector that functions as a reduced-state equalizer.

FIG. 1 illustrates an embodiment of a demodulator component 100 included in a receiver 110 for detecting transmitted symbols. The demodulator 100 performs coherent demodulation based on knowledge of the channel over which the symbols are transmitted. The channel comprises the net effect of the transmitter filter, propagation channel and receiver matched filter responses. The demodulator 100 includes a channel estimator 120 for estimating the channel and a symbol detector 130 for detecting transmitted symbols. The channel estimator 120 estimates the channel using known transmitted symbols such as a training sequence or pilot symbols. The demodulator 100 also whitens the received signal r(n) to remove at least some of the interference mixed with the desired signal during transmission. Whitening the received signal r(n) enables optimal detection of the transmitted symbols. The symbol detector 130 uses the whitened signal r(n) and the estimate of one or more channel taps h(k) generated by the channel estimator 120 to detect the symbols that were transmitted.

The channel taps are typically kept constant over an entire packet. However, for rapidly fading conditions, the channel can change significantly over a packet and without tracking the changes, the demodulation quality may suffer. Therefore, the demodulator 100 tracks the channel variation symbol by symbol. To balance the computational overhead of tracking with the radio performance, the demodulator 100 tracks m taps each symbol time where m is typically smaller than the number of channel taps. A special case is when the demodulator 100 only tracks a single tap and uses the single, time-varying tap to update all L+1 taps. The symbol detector 130 also estimates the probability of each of the S bits associated with a detected symbol. The probability information is referred to interchangeably herein as a soft bit value. The quality of the soft bit values b(n,i) generated by the symbol detector 130 has a significant impact on the subsequent channel decoding process carried out by a channel decoder 140 which corrects for bit errors where n refers to the symbol index and i the bit index within a symbol.

The symbol detector 130 functions as a reduced-state equalizer when generating the soft bit values b(n,i). The symbol detector 130 includes a trellis searcher 132 for building-out a trellis over a number of symbol times so that a symbol in a sequence of transmitted symbols can be reliably detected by tracing back through the trellis to identify the detected symbol at an earlier symbol time. The symbol detector 130 computes soft bit values for each past symbol time based on saved survivor metrics. The survivor metric associated with a particular trellis state indicates the probability that the state represents the transmitted symbol associated with the current symbol time. The survivor metrics are saved in a decision-delay buffer 134. The trellis searcher 132 also accumulates the symbol history for each trellis state and stores the symbol histories in the buffer 134. The symbol histories are updated for each new equalizer iteration.

A trellis searcher 132 uses the saved symbol histories to trace back through the trellis to detect a symbol at an earlier symbol time. A soft bit value calculator 136 component of the symbol detector 130 uses the saved survivor metrics associated with the immediately preceding symbol time to evaluate all M×1 trellis paths for the two successive symbol times. The soft bit value calculator 136 uses all of the corresponding delayed-decision path metrics calculated for the M×1 trellis paths to generate a soft bit value for each bit of the detected symbol. Delaying soft bit value generation in this way increases the accuracy of the soft bit values while still retaining the computational efficiency of the demodulator 100 because all paths are used to generate the soft bit values and M×1 path metrics are calculated for a single ending state instead of M×M path metrics for all M possible ending states.

The demodulator 100 can be implemented in hardware, firmware or some combination of both. In one embodiment, the demodulator 100 is implemented in hardware, e.g. as an ASIC (application-specific integrated circuit). In another embodiment, the demodulator 100 is implemented in firmware, e.g. via a DSP (digital signal processor). In yet another embodiment, a hybrid implementation is contemplated where the computational engine of the demodulator 100 is implemented as a hardware accelerator, e.g., as an ASIC and the control logic and other pre-processing functions of the demodulator 100 are implemented in firmware, e.g. via a DSP. In each case, those skilled in the art can implement various portions of the description, block diagrams and operational flows described herein in the form of computer-executable instructions, which may be embedded in one or more forms of computer-readable media. As used herein, computer-readable media may be any media that can store or embody information that is encoded in a form that can be accessed and understood by a computing device. Typical forms of computer-readable media include, without limitation, both volatile and nonvolatile memory, data storage devices, including removable and/or non-removable media, and communication media. The decision-delay buffer 134 accessed by the demodulator 100 can include any or all of these types or other types of computer-readable media.

In one embodiment, the demodulator 100 uses the two leading channel tap estimates h(k) calculated by the channel estimator 120 for managing the trellis. Performance improves, but complexity increases if more than 2 taps are considered for higher-order modulation constellations such as 32-QAM and 64-QAM. Using the two leading channel taps for trellis management implies that each state corresponds to a possible symbol value. For example, 32-QAM has 32-states, each state corresponding to a symbol in the modulation constellation. That is, there is a 1-1 relationship between a trellis state and a symbol. The trellis searcher 132 estimates the most likely path in the trellis that corresponds to the transmitted symbol sequence.

The trellis searcher 132 estimates the most likely path by generating different types of probability estimates referred to herein as metrics. One of the metrics calculated by the trellis searcher 132 is a survivor metric. Each state has a survivor metric, and depending on the scaling technique used, a state with a smaller survivor metric is more likely than a state with a larger survivor metric or vice versa. The survivor metric of state l is denoted as J(l). The survivor metrics are initialized at the beginning of a new symbol sequence using knowledge garnered from a training sequence or pilot symbols. The initialized survivor metrics correspond to the probabilities of the first transmitted symbol in the sequence. For example, there are 32 survivor metrics for the 32 states of a trellis associated with a 32-QAM constellation. A survivor metric of a particular state corresponds to the probability that the first transmitted symbol is the symbol represented by that state.

The demodulator 100 estimates the probability of the entire sequence of transmitted symbols. Accordingly, the trellis searcher 132 extends the trellis to the next symbol in the sequence, i.e. the second symbol. Extending the trellis in this way introduces the notion of a branch metric. A branch metric is a probability measure associated with a combination of an originating state and an ending state, i.e. how likely it is for the first symbol in the sequence to be represented by the originating state and the second symbol to be represented by the ending state. The branch metrics are denoted by B(l,k) where l denotes the originating state and k denotes the ending state. Returning to the example of a 32-QAM constellation, there are 32 possible values for the first symbol in the sequence and 32 possible values for the second symbol in the sequence. As such, there are 32×32=1024 possible symbol sequences corresponding to the first and second symbols. Each of the 1024 sequences corresponds to a path in the trellis and each path is associated with a probability measure called a path metric.

The path metric originating from state l and ending at state k is denoted as Γ(l,k). The path metric notation is similar to that of the branch metric notation. However, even though both a branch metric and a path metric are associated with a pair of particular states, a branch metric is associated only with a transition from one state to the next whereas a path metric is cumulative and associated with an entire path from the current symbol in the sequence all the way back to the very first symbol in the sequence. The demodulator 100 calculates a path metric from state l to state k by adding the branch metric B(l,k) to the survivor metric J(l) associated with state l as given by:

$$\Gamma(l,k)=J(l)+B(l,k) \quad (1)$$

The demodulator 100 operates as a reduced-state equalizer and thus evaluates only G×M paths where G<M and M is a function of the number of bits per symbol in the sequence of transmitted symbols. The G trellis states at the previous symbol time represent the states that are more likely than the remaining (M-G) states based on their corresponding survivor metrics. After all G×M path metrics have been calculated, the demodulator 100 uses an algorithm such as the Viterbi algorithm to select the most likely path metric ending at each current state.

Figure 2:
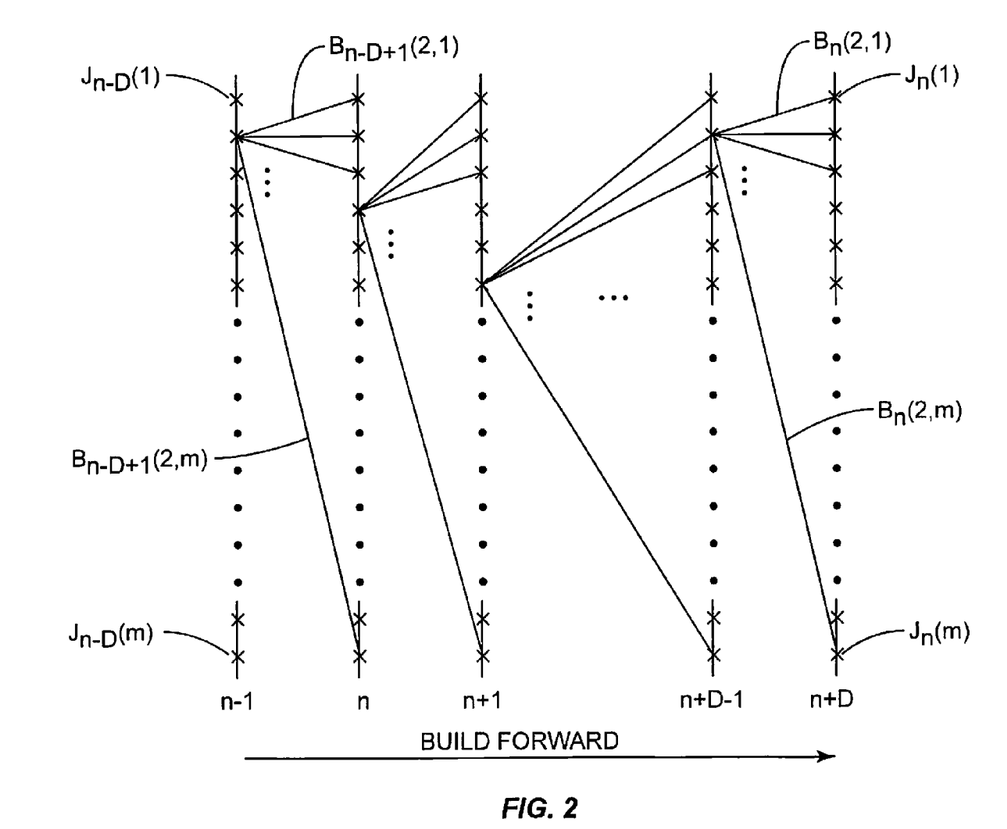
FIG. 2 illustrates a diagram of an embodiment of a trellis constructed by the demodulator of FIG. 1.

FIG. 2 illustrates an embodiment of a trellis managed by the demodulator 100 during processing of a sequence of transmitted symbols. The trellis is initialized based on a known training sequence or pilot symbols as described above. The survivor metrics and symbol histories determined during the trellis initialization are used by the trellis searcher 132 to begin building-out the trellis.

Figure 3:
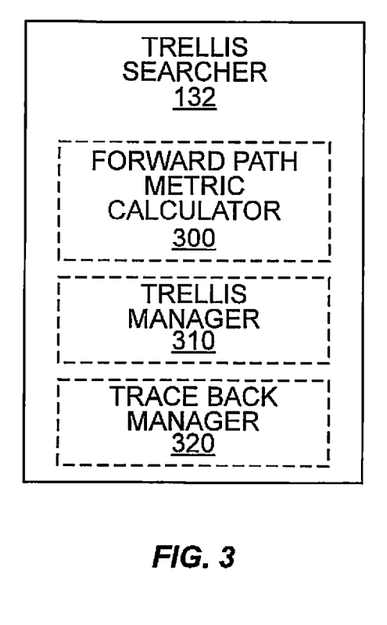
FIG. 3 illustrates a block diagram of an embodiment of a trellis searcher component of the demodulator of FIG. 1.

FIG. 3 illustrates an embodiment of the trellis searcher 132. The trellis searcher 132 includes a forward path metric calculator 300 for calculating G×M path metrics during each equalizer iteration, a trellis manager 310 for updating the trellis from one symbol time to the next and a trace-back manager 320 for identifying a detected symbol earlier in the sequence based on symbol history information stored in the decision-delay buffer 134. Operation of the trellis searcher 132 is explained next in more detail based on the trellis illustrated in FIG. 2 which shows the states from symbol time n−1 to symbol time n+D where D represents the decision depth of the demodulator. The decision depth D is preferably selected to account for echoes from past symbols. During the nth reduced-state equalizer iteration, the forward path metric calculator 300 computes G×M path metrics by paring G selected previous states from symbol time n−1 with all M current states from symbol time n in accordance with equation (1). In FIG. 2, state 2 at time n−1, state 4 at time n, state 6 at time n+1, etc. are each included in the subset of G selected previous states during the respective iteration. The demodulator 100 saves the information that will be modified in the following iteration, but needed later to generate the soft bit values as described in more detail later herein. For example, state 5 is not selected in n, but after its survivor metric has been determined during the trellis update, the survivor metric of state 5 is also saved together with the survivor metric of the states that are selected, for example state 4. After D iterations, the demodulator 100 tracks back to find the detected symbol at n+1 and uses all M survivor metrics at n to calculate the M path metrics linked to the detected symbol.

In one embodiment, the survivor metrics $J_{n-1}(l)$ calculated for all current trellis states l=0, 1, ..., M−1 at symbol time n−1 are stored in the decision-delay buffer 134 along with the m-tap estimate g(n,p),p=1, 2, ... m. The m-tap estimate g(n,p) is time-varying and indexed by n. Since there are m taps tracked, each individual tap has an index p whose value ranges from 1 to m. The updated symbol histories for each trellis state are also stored in the buffer 134. The information stored in the buffer 134 is subsequently used after D iterations to calculate the M path metrics from all M states at symbol time n−1 to the single current state that corresponds to the most likely or detected symbol at time n as will be described in more detail later herein. During the trellis search, G×1 path metrics have already be calculated. As such, the M×1 decision delayed path metrics include the G metrics plus M-G additional path metrics not previously calculated. Conventional reduced-state equalizers based on DFSE with all M×M path metrics available compute soft bit values when building-out the trellis and store the soft bit values for all M ending states in memory. As previously explained herein, not all path metrics are available for calculating the soft bit values when the trellis is pruned such as in case of a RSSE and MA equalizer. Accordingly, conventional soft bit values can be unreliable or even cannot be carried out at all due to missing path metrics unless additional path metrics are calculated, not for a single end state, but for all end states. In addition, more memory is required to store the soft bit values associated with each symbol time since S soft bit values per ending state must be saved and there are M ending states in total. The demodulator embodiments described herein store the survivor metrics and the m-tap estimate h(k) for each symbol time, not soft bit values. This significantly reduces the size of the buffer 134 used to store the survivor metrics and m-tap estimate h(k).

The trellis manager component 310 of the trellis searcher 132 updates the trellis during a subsequent equalizer iteration after the survivor metrics $J_{n-1}(l)$ and the m-tap estimate g(n,p) are stored in the decision-delay buffer 134. For each current state, the trellis manager 310 determines which one of the incoming paths is the best, i.e. the most likely. To assist the trellis manager 310 in making this determination, the forward path metric calculator 300 updates the survivor metric and survivor sequence (i.e., symbol history) for each current state at the new symbol time. According to one embodiment, the forward path metric calculator 300 determines a survivor $l_{min}(k)$ that has the minimum path metric as given by:

$$\Gamma(l_{min}(k),k) \le \Gamma(l,k) \text{ for } l \ne l_{min}(k) \quad (2)$$

The forward path metric calculator 300 also updates the survivor metric as given by:

$$J_n(k) = \Gamma(l_{min}(k),k) \quad (3)$$

and updates the symbol history of k by adding $l_{min}(k)$ to the existing symbol history of $l_{min}(k)$. The process of updating the survivor metrics and corresponding symbol histories for each trellis state and saving this information in the decision-delay buffer 134 is repeated for symbol times n<N where N is the number of symbols per packet or burst.

When the survivor metrics and corresponding symbol histories have been calculated for the D-th symbol and thereafter in the sequence of transmitted symbols, the demodulator 100 begins generating soft bit values for a symbol detected earlier in the symbol history. To enable the soft bit value calculator 136 to generate the soft bit values for the detected symbol, the trace back manager component 320 of the trellis searcher 132 traces back through the trellis from the most likely symbol state $k_{min}$ to the detected symbol associated with an earlier symbol time.

Figure 4:
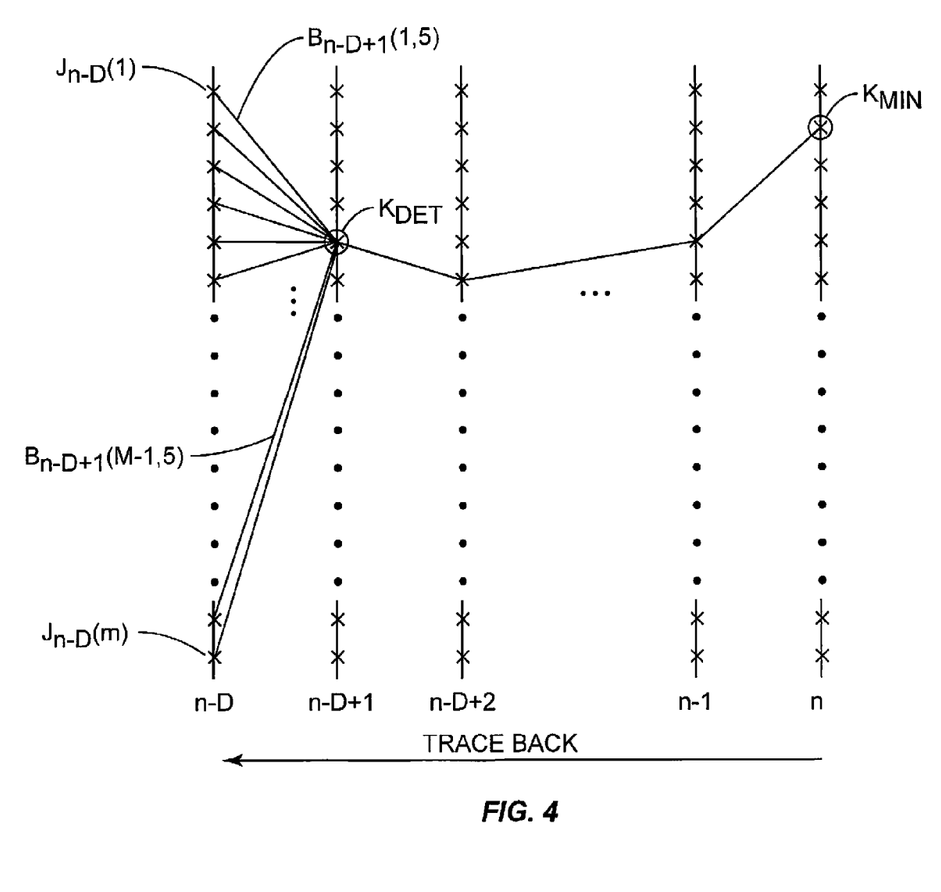
FIG. 4 illustrates a diagram of an embodiment of a trellis that is traced-back through by the demodulator of FIG. 1 for generating soft bit values.

FIG. 4 illustrates an embodiment of the trellis managed by the demodulator 100 during the trace-back process. FIG. 4 shows the trellis states associated with a current symbol time n back to a previous symbol time n−D. The trace back manager 320 traces back D−1 symbol times through the trellis from the most likely symbol state $k_{min}$ at time n to find the best state $k_{det}$ at time n−D+1 using the symbol history saved for state $k_{min}$. The state identified during the trace-back process represents the most likely symbol to have been transmitted at symbol time n−D+1 which is also referred to herein as the detected symbol. Once the detected symbol at time n−D+1 is identified, the soft bit value calculator 136 can generate soft bit values corresponding to symbol time n−D, using the detected symbol at n−D+1 as the ending state.

Figure 5:
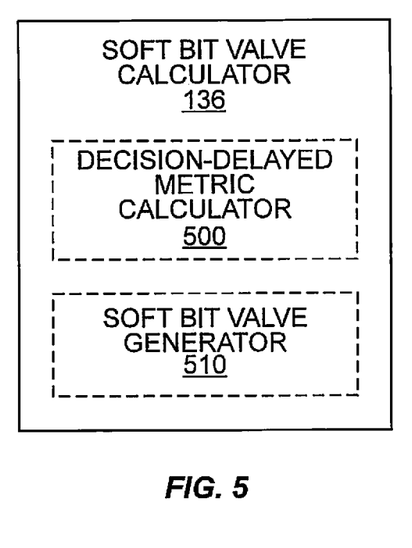
FIG. 5 illustrates a block diagram of an embodiment of a soft bit value calculator component of the demodulator of FIG. 1.

FIG. 5 illustrates an embodiment of the soft bit value calculator 136. According to this embodiment, the soft bit value calculator 136 includes a decision-delayed path metric calculator 500 and a soft bit value generator 510. The decision-delayed path metric calculator 500 calculates M decision-delayed path metrics for the M paths at time n−D into the detected state $k_{det}$ at time n−D+1. The path metrics are considered 'decision-delayed' because the metrics are associated with the past, i.e. from symbol time n−D to n−D+1. In contrast, the path metrics calculated by the trellis searcher are associated with the present time, i.e. from symbol time n−1 to n. This delay enables the soft bit value calculator 136 to generate soft both values for only one trellis state, i.e. kdet at each symbol period.

The path metrics computed by the decision-delayed path metric calculator 500 correspond to the possible transitions at symbol time n−D for all M trellis states to the single detected state $k_{det}$ at symbol time n−D+1. In one embodiment, the decision-delayed path metric calculator 500 retrieves the m-tap estimate g(k−D+1, p) corresponding to the m-taps tracked by the demodulator 100 out of the L channel taps provided by the channel estimator 120. The channel estimator 120 provides the L taps denoted as h'(k) where k=0, 1, 2, ... L−1. These L taps are kept constant over the period of a burst or a packet. The demodulator 100 tracks m taps denoted as g(n,p) where p=1, 2, ... m−1. These taps are time-varying every symbol time, and that is why the first index is n, the second index p is used to count the number of the tracked taps. In each iteration, the demodulator 100 generates the final L taps using both the L taps from the channel estimator 120 and the m tracked taps. This way, the final L taps are time-varying for better tracking of the radio channel variation. The final L taps are denoted as h(n,k) where k=0, 1, ... L−1. For example, if m=1, i.e. the demodulator 100 tracks only one tap, the second index p can be dropped so that g(n,0) becomes g(n). The final L taps can then be obtained by multiplying g(n) with each of the L constant taps h'(k), i.e. h(n,k)=h'(k)*g(n).

The m-tap estimate g(n,p) is stored in the decision-delay buffer 134 for symbol time n−D+1 and the survivor metrics $J_{n-D}(l)$, l=0, 1, ... M−1 for symbol time n−D from the buffer 134. The decision-delayed path metric calculator 500 then calculates M decision-delayed path metrics $\Gamma_{n-D+1}(l,k_{det})$ corresponding to the possible transitions l→$k_{det}$, l=0, 1, ... M−1 that occurred between time n−D and n−D+1, e.g. as shown in FIG. 4. The M decision-delayed path metrics are given by:

$$\Gamma_{n-D+1}(l,k_{det}) = J_{n-D}(l) + B_{n-D+1}(l,k) \text{ for } l=0, 1, \ldots M-1 \quad (4)$$

where $B_{n-D+1}(l,k)$ represents branch metrics corresponding to the transition from state l at symbol time n−D and to state k at symbol time n−D+1.

The soft bit value generator 510 calculates a soft bit value $b_{n-D+1}(i)$ for each of the bits of the detected symbol based on all M of the decision-delayed path metrics computed in accordance with equation (4). The detected symbol kdet serves as an end state for calculating soft bit values. That is, the soft bit values calculated are not associated with kdet at symbol time n−D+1, but rather with the symbol at symbol time n−D, i.e. one symbol before kdet. Symbol kdet is used as the ending state. As such, the soft bit values calculated actually are associated with symbol time n−D not with n−D+1. By selecting the best originating state from n−D, a decision can be made on the transmitted symbol at n−D. When calculating the soft bit values $b_{n-D+1}(l,k)$, all time-variant inputs are delayed by D−1 samples, i.e. r(n−D+1) is used instead of r(n) and h(k−D+1) is used instead of h(k), etc. The soft bit values can be calculated using any suitable algorithm such as the simplified SOVA. Only log2M soft bit values are calculated corresponding to a single detected symbol state $k_{det}$. Yet, all M paths are available for generating the soft bit values even though a reduced-state equalizer is used to build-out the trellis. In addition, no control logic is required to determine which path metrics need to be calculated. This provides an advantage for both DSP and ASIC-based implementations because control logic tends to inhibit the throughput of the demodulator computational engine. In addition, only (G+1)×M path metrics, G×M forward path metrics for the trellis search and M decision delayed path metrics for the soft bit value generation are calculated by the demodulator 100.

After the last sample has been processed, the demodulator 100 uses a known tail symbol, e.g. corresponding to a single current state to terminate the trellis and trace backward for calculating the soft values for the last transmitted symbol D in the sequence that has yet to be detected due to the decision delay. The time gap between updating the trellis and soft bit value generation enables the demodulator 100 to calculate soft bit values for only one state per symbol time. The demodulator 100 also does not store soft values for all states. Instead, only the m-tap estimate g(n,p) and survivor metrics associated with a span of D symbols (i.e. a decision delay) are saved. Furthermore, the demodulator 100 calculates G×M path metrics associated with the current transitions to update the trellis and M decision-delayed path metrics associated with the past transitions to generate soft values as compared to a conventional reduced-state equalizer which has to calculate many more path metrics to generate consistent soft bit values. When applied to 32-QAM for example, the inventive method reduces the buffer space needed for saving the metric information from 32×5×10=1600 memory words for conventional reduced-state equalizers to 10+320=330 words according to the demodulator embodiments described herein.

As an illustration of the advantages of the demodulator embodiments described herein, consider the following 32-QAM example where M=32 and G=4. Conventional reduced-state equalizers calculate 4 additional paths per current state. The total number of path metrics calculated according to a conventional reduced-state equalizers is (4+4)×32=256. Even with this many paths, the soft bit value quality can be far less than optimal because not all paths are available. The demodulator embodiments described herein calculate (G+1)×M path metrics=5×32=160. Even with far fewer paths for building the trellis, the soft bit value calculator 136 still has all paths available for generating soft bit values by tracing back through the trellis to identify a detected symbol and calculating decision-delayed path metrics for the detected symbol.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A method of generating soft bit values for a sequence of transmitted symbols using a demodulator, the method comprising:
    updating an M-state trellis managed by the demodulator responsive to a transition from symbol time n−1 to symbol time n, where M is a function of the number of bits per symbol in the sequence of transmitted symbols;
    saving survivor metrics associated with the M states of the trellis each symbol time so that the demodulator can calculate soft bit values with regard to transitions from symbol time n+D−1 to symbol time n+D, the survivor metrics indicating the probability that each respective state represents the transmitted symbol associated with symbol time n+D−1, where D is a decision depth of the demodulator; and
    tracing back through the trellis to calculate soft bit values for only a particular symbol detected at symbol time n−D based on survivor metrics saved for the M states at symbol time n−D.

2. The method of claim 1, comprising:
    updating a symbol history for each state in the trellis based on path metrics calculated for the M trellis states at a current symbol time n and G trellis states at a previous symbol time n−1, where G<M;
    identifying the trellis state for the current symbol time n most likely corresponding to a transmitted symbol;
    using the symbol history of the identified trellis state for tracing back to the trellis state at symbol time n−D+1 which corresponds to a detected symbol for symbol time n−D+1;
    determining decision-delayed path metrics for the M trellis states at symbol time N−D and the detected symbol for symbol time n−D+1 based on survivor metrics saved for the M trellis states at symbol time n−D; and
    generating soft bit values associated with the detected symbol for symbol time n−D+1 as a function of the decision-delayed path metrics.

3. The method of claim 2, wherein updating the symbol history for each state in the trellis comprises:
    identifying a minimum path metric calculated for each state at the current symbol time n; and
    adding the minimum path state to the symbol history of each state.

4. The method of claim 3, comprising saving the updated symbol history and the survivor metrics calculated for each of the trellis states at the current symbol time n before new path metrics and survivor metrics are calculated for symbol time n+1.

5. The method of claim 2, wherein determining the decision-delayed path metrics for the M trellis states at symbol time n−D and the detected symbol for symbol time n−D+1 comprises adding a survivor metric saved for each of the M trellis states at symbol time n−D to a corresponding branch metric calculated for each trellis state at symbol time n−D+1 and the detected symbol for symbol time n−D+1.

6. The method of claim 5, comprising determining the branch metrics associated with the detected symbol for symbol time n−D+1 as a function of received signal samples delayed n−D+1 symbol times and an m-tap channel estimate delayed n−D+1 symbol times.

7. The method of claim 6, comprising saving the m-tap channel estimate for each symbol time.

8. The method of claim 2, comprising inputting the decision-delayed path metrics to a soft-output viterbi calculator for generating the soft bit values associated with the detected symbol for symbol time n−D.

9. The method of claim 1, comprising:
    using a known tail symbol for tracing back to the trellis state at symbol time N+1 where N is the number of symbols to be detected and corresponds to the last detected symbol in the sequence of transmitted symbols; and generating soft bit values for the last detected symbol in the sequence of transmitted symbols based on survivor metrics saved for the M trellis states at symbol time N.

10. A receiver comprising:
a demodulator, including a symbol detector, the demodulator further configured to
update an M-state trellis responsive to a transition from symbol time n−1 to symbol time n, wherein M is a function of the number of bits per symbol in a sequence of transmitted symbols;
save survivor metrics associated with the M states of the trellis each symbol time so that the demodulator can calculate soft bit values with regard to transitions from symbol time n+D−1 to symbol time n+D, the survivor metrics indicating the probability that each respective state represents the transmitted symbol associated with symbol time n+D−1, where D is a decision depth of the demodulator; and
trace back through the trellis to calculate soft bit values for only a particular symbol detected at symbol time n−D based on survivor metrics saved for the M states at symbol time n−D.

11. The receiver of claim 10, wherein the demodulator comprises:
a trellis searcher configured to:
update a symbol history for each state in the trellis based on path metrics calculated for the M trellis states at a current symbol time n and G trellis states at a previous symbol time n−1, where G<M,
identify the trellis state for the current symbol time n most likely corresponding to a transmitted symbol, and
use the symbol history of the identified trellis state for tracing back to the trellis state at symbol time n−D+1 which corresponds to a detected symbol for symbol time n−D+1;
a soft value calculator configured to:
determine decision-delayed path metrics for the M trellis states at symbol time n−D and the detected symbol for symbol time n−D+1 based on survivor metrics saved for the M trellis states at symbol time n−D, and
generate soft bit values associated with the detected symbol for symbol time n−D+1 based on the decision-delayed path metrics; and
a buffer configured to store the survivor metrics for the M trellis states at each symbol time over a span of D symbols.

12. The receiver of claim 11, wherein the trellis searcher is configured to update the symbol history for each state in the trellis by identifying a minimum path metric calculated for each state at the current symbol time n and adding the minimum path state to the symbol history of each state.

13. The receiver of claim 12, wherein the buffer is configured to store the updated symbol history and the survivor metrics calculated for each of the trellis states at the current symbol time n before new path metrics and survivor metrics are calculated for symbol time n−1.

14. The receiver of claim 11, wherein the soft value calculator is configured to determine the decision-delayed path metrics by adding a survivor metric saved for each of the M trellis states at symbol time n−D to a corresponding branch metric calculated for each trellis state at symbol time n−D+1 and the detected symbol for symbol time n−D+1.

15. The receiver of claim 14, wherein the soft value calculator is configured to determine the branch metrics associated with the detected symbol for symbol time n−D+1 as a function of received signal samples delayed n−D+1 symbol times and an m-tap channel estimate delayed n−D+1 symbol times.

16. The receiver of claim 15, wherein the buffer comprises a circular buffer configured to store the one-tap channel estimate for each symbol time over a period of the D symbols.

17. The receiver of claim 11, wherein the soft value calculator comprises a soft-output viterbi calculator is configured to generate the soft bit values associated with the detected symbol for symbol time n−D responsive to the decision-delayed path metrics.

18. The receiver of claim 10, wherein the demodulator is configured to use a known tail symbol for tracing back to the trellis state at symbol time N+1 where N is the number of symbols to be detected and corresponds to the last detected symbol in the sequence of transmitted symbols and generate soft bit values for the last detected symbol in the sequence of transmitted symbols based on survivor metrics saved for the M trellis states at symbol time N.

19. One or more non-transitory computer-readable storage media containing executable instructions that, when executed, cause a demodulator to:
update an M-state trellis managed by a demodulator responsive to a transition from symbol time n−1 to symbol time n, where M is a function of the number of bits per symbol in a sequence of transmitted symbols;
save survivor metrics associated with the M states of the trellis each symbol time so that the demodulator can calculate soft bit values with regard to transitions from symbol time n+D−1 to symbol time n+D, the survivor metrics indicating the probability that each respective state represents the transmitted symbol associated with symbol time n+D−1, where D is a decision depth of the demodulator; and
trace back through the trellis to calculate soft bit values for only a particular symbol detected at symbol time n−D based on survivor metrics saved for the M states at symbol time n−D.

20. The non-transitory computer-readable storage media according to claim 19, wherein the executable instructions, when executed, cause the demodulator to:
update a symbol history for each state in the trellis based on path metrics calculated for the M trellis states at a current symbol time n and G trellis states at a previous symbol time n−1, where G<M;
identify the trellis state for the current symbol time n most likely corresponding to a transmitted symbol;
use the symbol history of the identified trellis state for tracing back to the trellis state at symbol time n−D−1 which corresponds to a detected symbol for symbol time n−D+1;
determine decision-delayed path metrics for the M trellis states at symbol time n−D and the detected symbol for symbol time n−D−1 based on survivor metrics saved for the M trellis states at symbol time n−D; and
generate soft bit values associated with the detected symbol for symbol time n−D+1 as a function of the decision-delayed path metrics.

* * * * *